(12) United States Patent
Birkmeyer et al.

(10) Patent No.: US 9,085,152 B2
(45) Date of Patent: Jul. 21, 2015

(54) ETCHING PIEZOELECTRIC MATERIAL

(75) Inventors: Jeffrey Birkmeyer, San Jose, CA (US); Youming Li, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 695 days.

(21) Appl. No.: 12/991,901

(22) PCT Filed: May 12, 2009

(86) PCT No.: PCT/US2009/043631
§ 371 (c)(1),
(2), (4) Date: Feb. 3, 2011

(87) PCT Pub. No.: WO2009/142960
PCT Pub. Date: Nov. 26, 2009

(65) Prior Publication Data
US 2011/0117311 A1 May 19, 2011

Related U.S. Application Data

(60) Provisional application No. 61/055,431, filed on May 22, 2008.

(51) Int. Cl.
C23F 1/12 (2006.01)
B41J 2/16 (2006.01)
H01L 21/311 (2006.01)
H01L 41/332 (2013.01)

(52) U.S. Cl.
CPC ............... *B41J 2/161* (2013.01); *B41J 2/1623* (2013.01); *B41J 2/1628* (2013.01); *B41J 2/1629* (2013.01); *B41J 2/1632* (2013.01); *B41J 2/1646* (2013.01); *H01L 21/31138* (2013.01); *H01L 41/332* (2013.01); *Y10T 428/24802* (2015.01); *Y10T 428/24917* (2015.01)

(58) Field of Classification Search
None
See application file for complete search history.

(56) References Cited

U.S. PATENT DOCUMENTS

| 6,306,313 | B1 | 10/2001 | Fetter et al. | |
| 7,052,117 | B2 | 5/2006 | Bibl et al. | |
| 2001/0042291 | A1 | 11/2001 | Esashi et al. | |
| 2003/0031794 | A1* | 2/2003 | Tada et al. | 427/255.391 |
| 2005/0099467 | A1* | 5/2005 | Bibl et al. | 347/68 |
| 2005/0192421 | A1 | 9/2005 | Xu et al. | |
| 2005/0200236 | A1* | 9/2005 | Buhler et al. | 310/317 |
| 2005/0248238 | A1 | 11/2005 | Yamada et al. | |
| 2006/0137822 | A1* | 6/2006 | Cowans | 156/345.51 |
| 2006/0187272 | A1* | 8/2006 | Torii et al. | 347/68 |
| 2006/0197414 | A1* | 9/2006 | Takahashi et al. | 310/348 |
| 2006/0250456 | A1* | 11/2006 | Matsuzawa et al. | 347/68 |
| 2007/0013014 | A1* | 1/2007 | Guo et al. | 257/417 |

(Continued)

FOREIGN PATENT DOCUMENTS

WO 02/066258 8/2002
WO 2009/142960 11/2009

OTHER PUBLICATIONS

International Preliminary Report on Patentability dated Dec. 2, 2010 issued in international application No. PCT/US2009/043631, 8 pgs.

(Continued)

*Primary Examiner* — Shamim Ahmed
*Assistant Examiner* — Bradford Gates
(74) *Attorney, Agent, or Firm* — Fish & Richardson P.C.

(57) ABSTRACT

Piezoelectric material is shaped by plasma etching to form deep features with high aspect ratios, and desired geometries.

20 Claims, 7 Drawing Sheets

(56) References Cited

U.S. PATENT DOCUMENTS

| | | | |
|---|---|---|---|
| 2007/0024672 A1 | 2/2007 | Hano et al. | |
| 2007/0035207 A1* | 2/2007 | Kawamura et al. | 310/324 |
| 2007/0041076 A1* | 2/2007 | Zhong et al. | 359/290 |
| 2007/0084042 A1 | 4/2007 | Challoner et al. | |
| 2007/0115078 A1* | 5/2007 | Sano et al. | 333/187 |
| 2007/0164634 A1 | 7/2007 | Yao et al. | |
| 2008/0062229 A1 | 3/2008 | Tokunaga et al. | |
| 2008/0073680 A1* | 3/2008 | Wang | 257/295 |
| 2008/0277672 A1* | 11/2008 | Hovey et al. | 257/82 |
| 2009/0108708 A1* | 4/2009 | Jiang et al. | 310/334 |

OTHER PUBLICATIONS

Kokaze et al., Dry Etching Process for Pb(Zr,Ti)O3 Thin-Film Actuators, *Japanese Society of Applied Physics*, vol. 46, No. 1, 2007, pp. 280-282.

S. Marks and J.P. Almerico, Profile and Etch Characterization of High Wafer Temperature Etched Y1/Pt Stacks, *Integrated Ferroelectrics*, vol. 66, No. 1, 2004, pp. 19-27.

International Search Report and Written Opinion dated Jul. 6, 2009 issued in international application No. PCT/US2009/043631, 9 pgs.

* cited by examiner

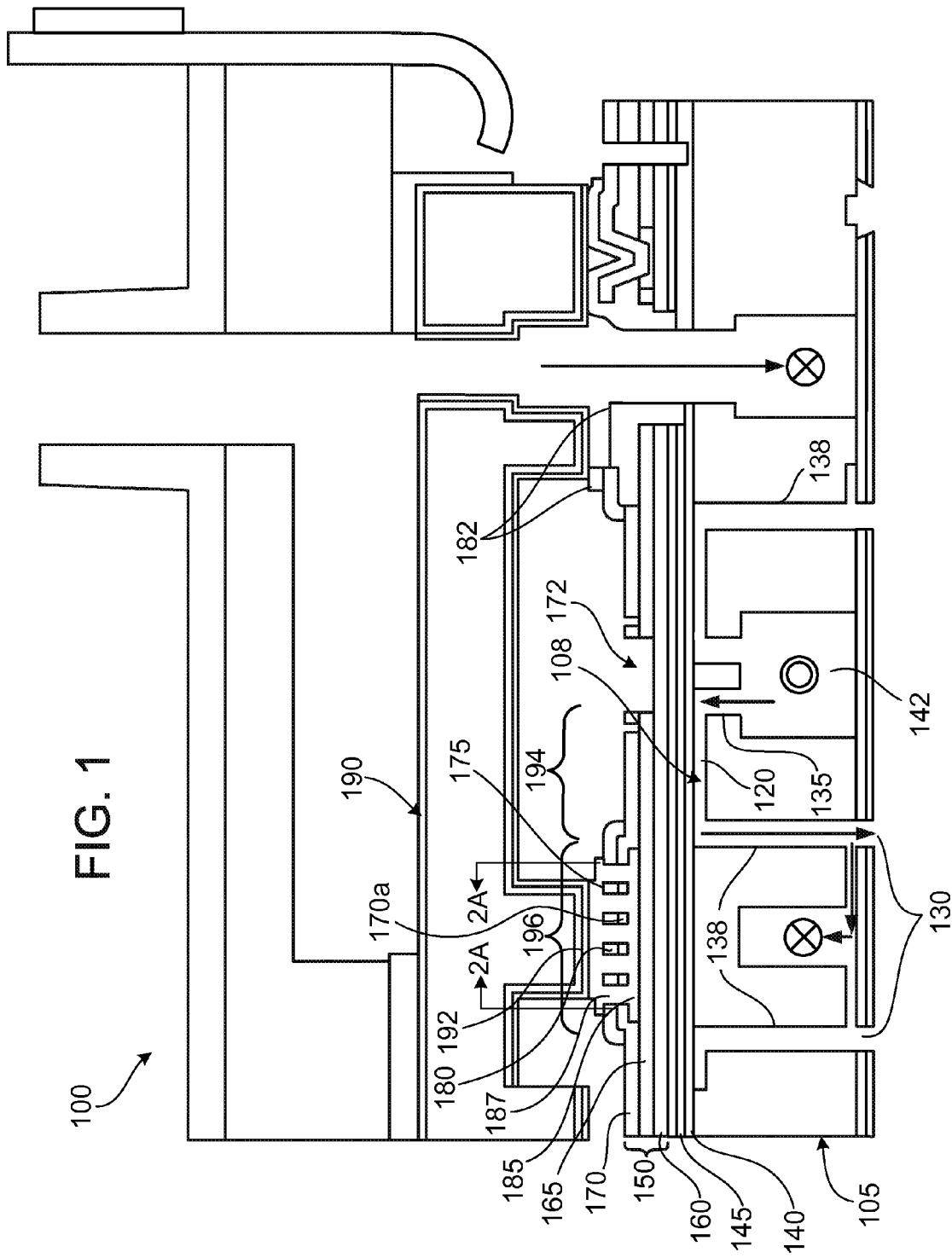

ETCHING PIEZOELECTRIC MATERIAL

CROSS-REFERENCE TO RELATED APPLICATIONS

This application is the national stage of International Application Number PCT/US2009/043631, filed on May 12, 2009, which is based on and claims the benefit of the filing date of U.S. Provisional Application No. 61/055,431, filed on May 22, 2008, both of which as filed are incorporated herein by reference in their entireties.

TECHNICAL FIELD

This invention relates to etching piezoelectric material, e.g. for use in actuators for ink jet printheads.

BACKGROUND

Ink jet printers typically include an ink path from an ink supply to a nozzle path. The nozzle path terminates in a nozzle opening from which ink drops are ejected. Ink drop ejection is controlled by pressurizing ink in the ink path with an actuator, which may be, for example, a piezoelectric deflector, a thermal bubble jet generator, or an electro statically deflected element. A typical printhead has an array of ink paths with corresponding nozzle openings and associated actuators, and drop ejection from each nozzle opening can be independently controlled. In a drop-on-demand printhead, each actuator is fired to selectively eject a drop at a specific pixel location of an image as the printhead and a printing substrate are moved relative to one another. In high performance printheads, the nozzle openings typically have a diameter of 50 micron or less, e.g. around 25 microns, are separated at a pitch of 100-300 nozzles/inch.

U.S. Pat. No. 7,052,117 describes a printhead that has a semiconductor which is etched to define ink chambers. A piezoelectric actuator has a layer of piezoelectric material, which changes geometry, or bends, in response to an applied voltage. The bending of the piezoelectric layer pressurizes ink in a pumping chamber located along the ink path. A film of piezoelectric material is shaped into actuator regions by sawing.

SUMMARY

In an aspect, the invention features a method including shaping a piezoelectric material, e.g. PZT, by exposing the material to plasma etching conditions and etching a feature having a depth of about 1 micron or more.

In an aspect, the invention features a method comprising shaping a piezoelectric material by exposing the material to plasma etching conditions, etching a feature having an aspect ratio of about 2 to 1 or more, and forming an island having a geometry other than a square or a rectangle.

In an aspect, the invention features an assembly including a piezoelectric material with a thickness of about 5 to 25 microns and a masking material having a pattern feature defining the location of a piezoelectric feature. The masking material has a thickness of about 20 micron or less and the mask pattern feature has an aspect ratio of about 10 to 1 or less.

In an aspect, the invention features a method of processing piezoelectric material including providing a piezoelectric substrate, depositing a masking material on a surface of the substrate, patterning the masking material to form a mask pattern using a wet etch, transferring the patterning of the mask to the piezoelectric material to form piezoelectric features using a plasma etch, and stripping the mask material using a wet etch.

Implementations may include one or more of the following. A piezoelectric feature is formed having a depth of about 5 microns or more, and/or an aspect ratio of about 2 to 1 or greater. The feature is an island having an edge shape other than a square or a rectangle. The etching rate of the piezoelectric material is about 50 nm/min or more, e.g. about 100 nm/min or more. The piezoelectric material is poled prior to etching and etching said feature without depoling the material. The piezoelectric material is etched while maintaining the piezoelectric material below the Curie temperature. A mask is provided to define the feature, wherein the mask etches at a rate about four or more times less than the rate of etching the piezoelectric material. A mask material is provided and the mask material is patterned by wet etching to define the location of a feature. A mask is provided to define the feature, wherein the mask is removed by wet etching after etching said feature. The masking material is a metal including NiCr or a combination thereof. The platen temperature is about 100° C. or less, e.g. about 30° C. or less. The thickness of the piezoelectric material is reduced after etching. The etched piezoelectric material is utilized in an actuator, e.g. an ink jet printhead.

Implementations may include one or more of the following. An assembly of wherein the piezoelectric material is a wafer of uniform thickness. An assembly wherein the piezoelectric material is a wafer having a feature corresponding to the mask pattern feature, wherein the wafer feature has a depth of about 5 micron or more and/or an aspect ratio of about 2 to 1 or greater. An assembly wherein the feature has an edge shape other than a square or a rectangle. The masking material is a metal. The thickness of the masking layer is about 3 micron or more. The ametal is etchable by ceric ammonium nitrate wet etch. The masking material has a thickness of about 10 micron or less. The mask pattern has features with an aspect ratio of about 10 to 1 or less.

Implementations may include one or more of the following advantages. A piezoelectric material, such as a wafer or thin film, can be shaped with a deep feature (e.g., about 5 microns or greater) and/or a high aspect ratio (e.g. about 2 or greater), and/or formed into irregular shapes (e.g., other than squares or rectangles, such as islands with rounded corners, circles, polygons such as pentagons or hexagons, or any other shape). The piezoelectric material can be processed at relatively low temperatures, such as below the Curie temperature, e.g., below 200° C., so that poled piezoelectric material can be shaped without depoling. The processing can include plasma etching under conditions with high selectivity for PZT. The process can utilize a mask material with high plasma etch selectivity for PZT that can also be etched readily by wet etching without substantially etching the piezoelectric material to transfer a feature pattern to the mask or to strip the mask after plasma etching the piezoelectric features. The mask can be thin and with low aspect ratio pattern features to facilitate accurate feature formation in the piezoelectric material. For example, a high selectivity, low cost, wet etch removable masking metal material such as a NiCr alloy can be employed. The etching temperature can be selected to enhance selectivity of the masking material. The piezoelectric material can be etched at a rapid rate, e.g., 25 nm/min or more and at an etch rate substantially greater than the masking material, e.g., four times greater or more. A feature can be formed in a relatively thick wafer, and the shaped wafer subsequently processed to reduce its thickness, e.g., by grinding. The processed piezoelectric material can be utilized, e.g. in piezoelectric actuators, e.g. for ink jet printheads, in a closely packed footprint not limited by geometries typical of mechanical sawing. The material can as well be used for wafer level integration in many applications or MEMS devices.

Details of one or more implementations are set forth in the accompanying drawings and the description below. Other features and advantages may be apparent from the description and drawings, and from the claims.

DESCRIPTION OF DRAWINGS

FIG. 1 is a cross-sectional view of a multi-layered actuator in a drop-on-demand ink jet printhead.

Like reference symbols in the various drawings indicate like elements.

DETAILED DESCRIPTION

Figure 2A:
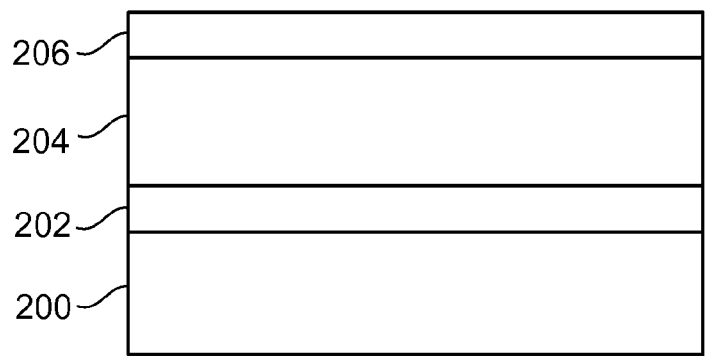
FIGS. 2A-2F are cross-sectional views illustrating processing piezoelectric material.

FIG. 1 is a cross-sectional view of a multi-layered actuator in a drop-on-demand fluid ejection system, e.g. an ink jet printhead. A printhead device 100 has a number of jetting structures, each of which is associated with an actuator 150 and a fluid path 108. The actuator 150 is supported on a substrate 105, within which fluid paths are formed. The substrate 150 can include a membrane 140, such as a layer of silicon, which seals one side of a pumping chamber 120 in the fluid path 108. The membrane can be relatively thin, such as less than 25 µm, for example about 12 µm. A single fluid path 108 includes an ink feed 142, an ascender 135, a pumping chamber 120, a descender 138 and a nozzle 130. When the actuator 150 is activated, fluid is forced through the fluid path 108 and out the nozzle 130. The actuator 150 includes a lower conductive layer 160, a piezoelectric layer 165, and an upper conductive layer 170. The piezoelectric layer 165 can be between e.g. about 1 and 25 microns thick, e.g., about 8 to 18 microns thick. In embodiments, the piezoelectric layer 165 is metalized with a metal that forms the lower conductive layer 160. The metalized piezoelectric layer 165 can be bonded onto the substrate 105, for example, using a eutectic bond between two metals or an adhesive material.

The piezoelectric material in the actuator is formed by processing a piezoelectric wafer. The wafer is formed by grinding a relatively thick prefired piezoelectric material to a desired thickness or piezoelectric material can be formed by physical vapor deposition, solgel application, ceramic green sheet application or another suitable deposition technique. The wafer is then processed to shape by sectioning or thickness reduction to form piezoelectric components for the actuators.

The wafer is shaped by using plasma etching and mask materials to form relatively deep, high aspect features of any geometry at a rapid etch rate, and low temperature. This technique permits the piezoelectric material to be shaped after it has been poled since etching can be conducted below the Curie temperature. The etching can be conducted before the wafer thickness is reduced by grinding because deep features can be formed at high etch rates. Dry etching PZT rather than sawing also allows PZT islands that have irregular shapes, such as rounded corners, circular, pentagons, hexagons, or any other shape. This facilitates wafer level integration into various MEMS devices. For example, the PZT actuators can be more closely packed together in a smaller footprint since the design is no longer limited by the dimensions or geometry necessary for mechanically sawing the PZT actuators. The side wall angle of a feature can be controlled by adjusting power levels and selecting mask materials. A faster etching mask provides more taper.

In some embodiments, the piezoelectric material is plasma etched using an inductively coupled plasma (ICP) source. In embodiments the material is fixed to a platen in a chamber including a gas and a plasma is generated. Operating conditions, including the gas mixture, chamber temperature, platen temperature, and the masking materials are selected in coordination to provide high selectivity for etching PZT and rapid etch rates. In embodiments, the gas mixture includes hydrogen, which controls redeposition of metals, such as lead, etched from the PZT by, it is believed, forming lead hydrides. In particular embodiments, gas mixtures include carbon-halides, e.g. fluoride gases, and hydrogen. In particular embodiments, the gas mixture includes $C_4F_8$, argon, and hydrogen (e.g., about 10% or more of $C_4F_8$, about 10% or more of hydrogen, and the remainder being argon). In addition, the chamber wall temperature can be maintained relatively high, e.g. about 100° C. or above, to control redeposition. In embodiments, the etch rate is about 50 nm/min or greater, e.g., 100 to 500 nm/min.

A masking material with a high selectivity to PZT facilitates etching deep trenches because a masking material with a high selectivity etches at a slower rate than the PZT etch rate. For example, in embodiments, the etch rate of the mask is about four or more times slower than PZT. In addition, the masking material is preferably itself etchable by a process that allows rapid etching through a resist, to facilitate pattern transfer to the mask and then stripped after etching the piezoelectric material without substantially modifying the shaped features. In embodiments, the mask material can be selectively etched and stripped by wet etch. In embodiments, the selectivity and wet etching characteristics are such that a thin mask layer can be used, e.g. about 20 microns or less, e.g. about 10 or 5 microns or less and/or about 3 micron or more, and formed with mask features with an aspect ratio of about 20 to 1 or less, e.g. 5 to 1 or less. A suitable mask material is a metal alloy such as NiCr. In one example, the NiCr masking material is composed of about 80% Ni and 20% Cr. NiCr is non-magnetic, which makes it easier to sputter using a physical vapor deposition (PVD) tool that includes a magnetron. NiCr can plasma etch at a rate about eight times slower than PZT, in which the NiCr etches at about 25 nm/min or less and PZT etches at about 150-200 nm/min. Since the masking material is being etched at a slower rate, less of the masking material is being etched and therefore a thinner masking layer is needed. NiCr is less expensive than hard mask material such as iridium and platinum and the remaining mask can be easily removed using a Cr wet etch. A suitable wet etch system is a ceric ammonium nitrate based system. An example is Chromium etchant 1020 available from Transene, Danvers, Mass.

During etching, the piezoelectric wafer is electrostatically adhered to a platen. Etching at lower platen temperatures (e.g., −10° C. to 20° C.) improves the selectivity of the masking material. For example, etching above about 100° C. can decrease the selectivity of NiCr to PZT. Additionally, etching at higher temperatures can depole the PZT if the temperature is above the Curie temperature of the PZT, such as above 200°

C. A suitable ICP apparatus is the Advanced Planar Source (APS) System, available from Surface Technology Systems (STS) Technologies, South Wales, UK. The platen is cooled by liquid circulation. Platen temperature is monitored by measuring coolant temperature. The wafer cooling is further facilitated by a flow of gas, e.g. He, between the platen and wafer. Plasma etching is discussed in Kokaze et al the Japanese Society of Applied Physics, Vol. 46, No. 1, 2007, pp. 280-282 and WO 02/066258.

Example

A piezoelectric wafer is processed as follows. A prefired piezoelectric wafer having a thickness of about 1 cm is ground to a film with a thickness of about 5 to 50 microns. The film is shaped by plasma etching as described below.

Conditions

Plasma source: APS ICP
Platen power: 600 watts
Coil power: 1700 watts
Frequency: 13.56 mHz
Gas pressure: 10 mTorr
Gas: 10% $C_4F_8$/10% hydrogen/argon (balance)
Ar flow: 65 sccm
$H_2$ flow: 8 sccm
$C_4F_8$: 5 sccm
Platen temperature: −10° C.
Wall temperature: 100-130° C.
Backside He: 6 ton
Mask material: 80% Ni/20% Cr
Mask thickness: 2-3 microns
Mask wet etch: Chromium etchant 1020, Transene
Photo resist system: 1 μm thick AZ-4100 series, available from AZ Electronic Chemicals, N J.
Piezoelectric etch rate: 150-200 nm/min
Mask etch rate: 15-25 nm/min

| Conditions | |
| --- | --- |
| Plasma source: | APS ICP |
| Platen power: | 600 watts |
| Coil power: | 1700 watts |
| Frequency: | 13.56 mHz |
| Gas pressure: | 10 mTorr |
| Gas: | 10% $C_4F_8$/10% hydrogen/argon (balance) |
| Ar flow: | 65 sccm |
| $H_2$ flow: | 8 sccm |
| $C_4F_8$: | 5 sccm |
| Platen temperature: | −10° C. |
| Wall temperature: | 100-130° C. |
| Backside He: | 6 torr |
| Mask material: | 80% Ni/20% Cr |
| Mask thickness: | 2-3 microns |
| Mask wet etch: | Chromium etchant 1020, Transene |
| Photo resist system: | 1 μm thick AZ-4100 series, available from AZ Electronic Chemicals, NJ. |
| Piezoelectric etch rate: | 150-200 nm/min |
| Mask etch rate: | 15-25 nm/min |

Figure 2B:
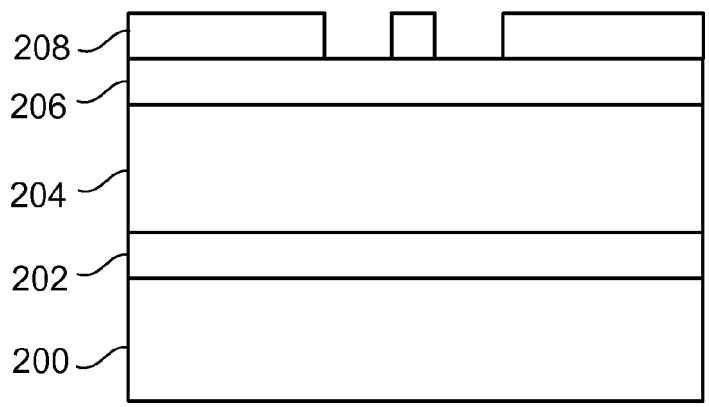
Figure 2C:
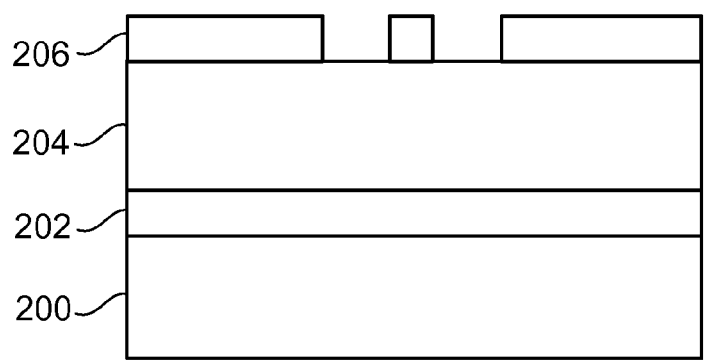

Referring to FIG. 2A, a base wafer 200, e.g. silicon, is provided with metal layer 202, e.g. NiCr usable, e.g. as a lower electrode, a piezoelectric layer 204, and a thin masking layer 206 provided by sputter deposition. Referring to FIG. 2B, a photoresist 208 is applied to the mask layer 206 and patterned. Referring to FIG. 2C, the pattern of the photoresist layer is transferred to the mask layer 206 by wet etching and the photoresist is plasma stripped.

Figure 2D:
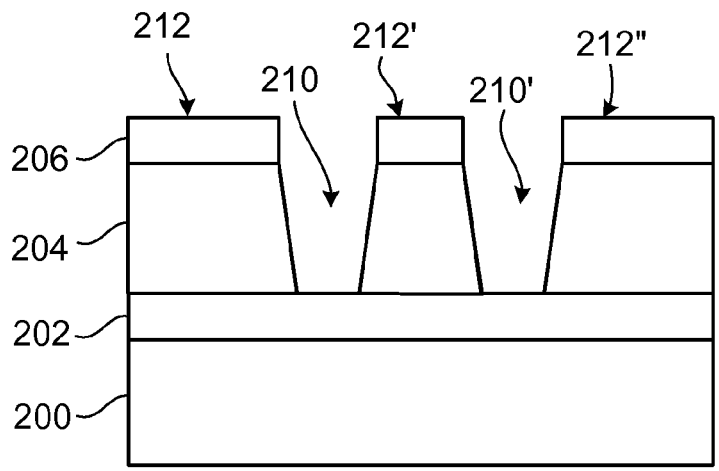
Figure 2E:
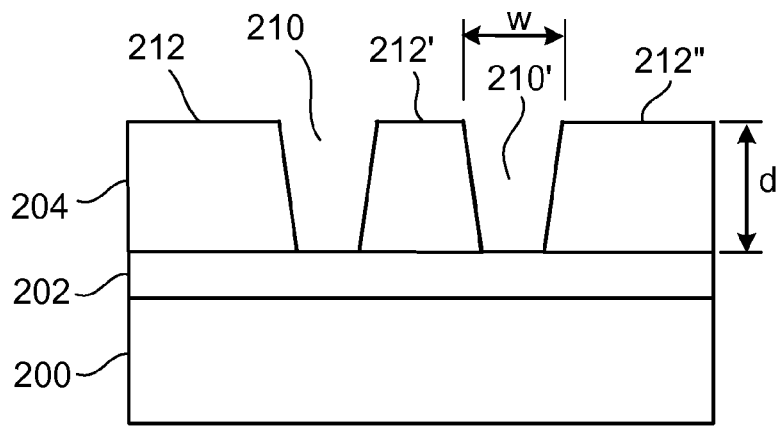

Referring to FIG. 2D, the piezoelectric material 204 is etched by plasma etching as described above to form features, such as trenches 210, 210' and islands 212, 212', 212" defined by the thin masking layer. Referring to FIG. 2E, the remaining mask material is stripped with a wet etch. The trenches and islands have substantial depth (height) d, e.g. 5-50 micron, such as 15-20 micron. In embodiments, the width, w, is about 5 to 25 micron. The aspect ratio of a feature is the depth, d, divided by its width, w, at the piezoelectric film surface. The aspect ratio of the feature is about 2 to 1 or greater, e.g. about 5 or 10 to 1 or greater. The islands can be utilized as active device areas.

Figure 2F:
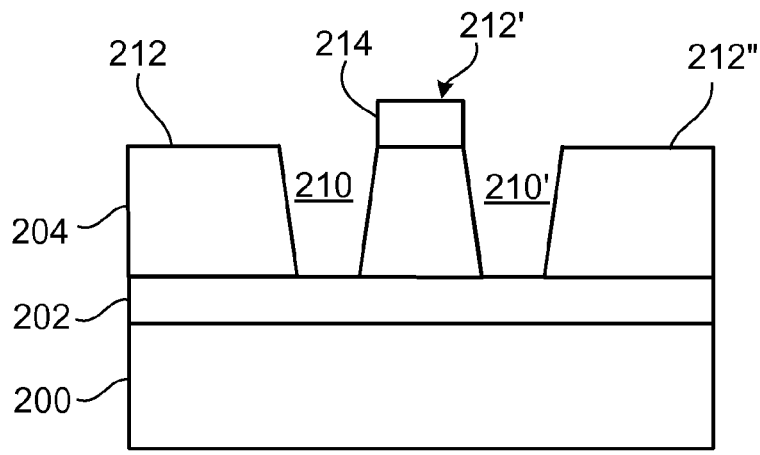

Referring to FIG. 2E, the remaining mask material is stripped with a wet etch. Referring to FIG. 2F, a metal layer 214 can be applied as an upper electrode where desired and the actuator incorporated into the desired device.

In particular embodiments, after the PZT is etched, the NiCr is stripped from the top of the PZT, and then the upper electrode layer is deposited, resist is deposited on the electrode layer and patterned to remove the metal in the trenches and anywhere else it is not desired. Before the NiCr mask is stripped from the top surfaces of the PZT, the trenches can be filled in with photoresist to protect the lower NiCr electrode layer (e.g. ground electrode). The NiCr is then stripped from the top surfaces, the resist in the trenches is stripped, and then the upper electrode layer is deposited and patterned. The NiCr etch mask can also include a layer of Ti-tungsten (TiW) (e.g. 300-500 Å thick) underneath it to improve the adhesion of the NiCr to the PZT. The NiCr is patterned and then the TiW and PZT are plasma etched together. Alternatively, the TiW can be wet etched before the PZT is plasma etched. The lower NiCr electrode layer can act as an etch stop when the PZT is plasma etched.

Figure 3:
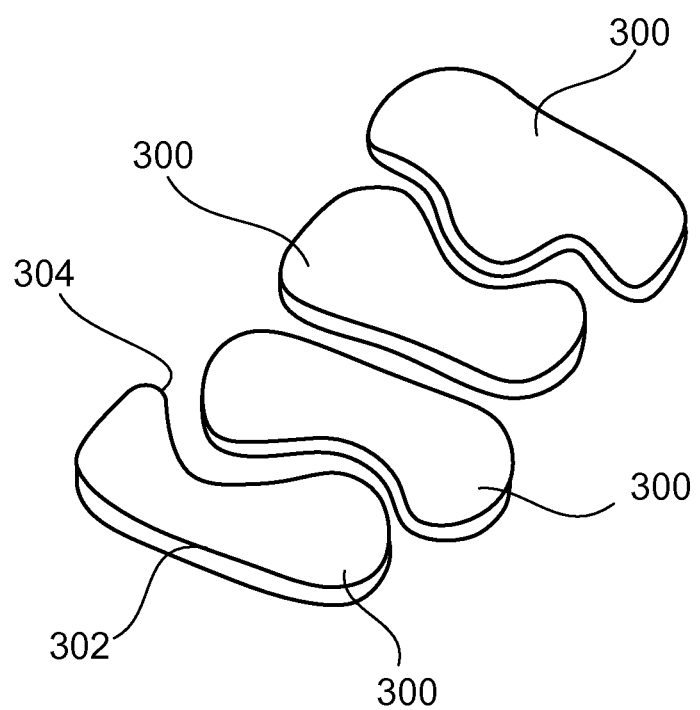
FIG. 3 is a plan view schematic of a series of etched piezoelectric features.
Figure 4A:
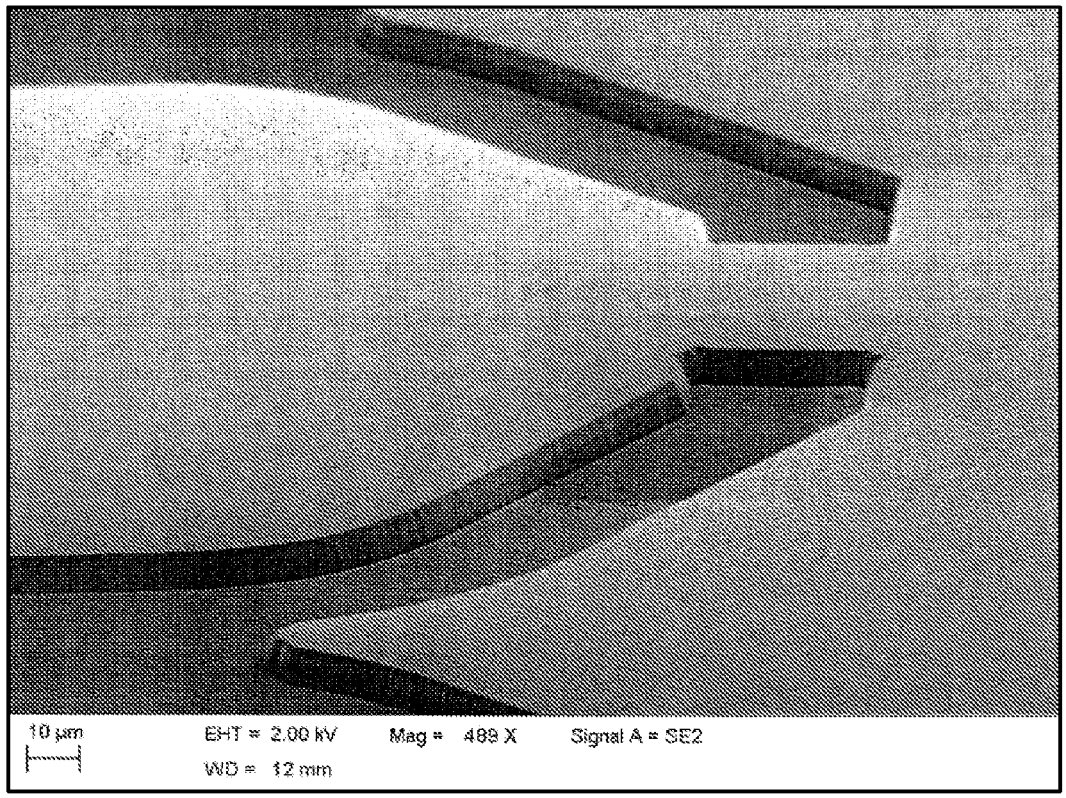
FIG. 4A is an SEM perspective image of an etched piezoelectric material.
Figure 4B:
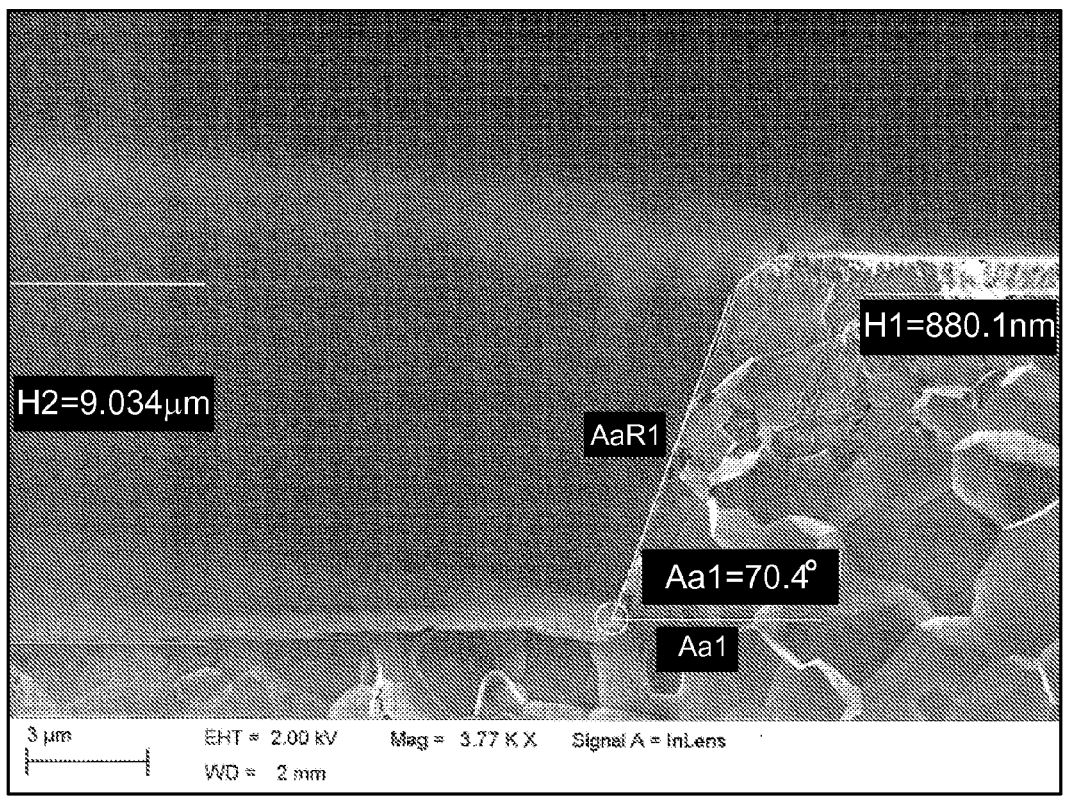
FIG. 4B is an SEM cross-sectional image of an etched piezoelectric material.

Referring to FIG. 3, a feature such as islands 300 can be formed having shapes including curvilinear sections 302 and straight sections 304, and the features nested in a dense array. Referring to FIGS. 4A and 4B, SEM images of etched piezoelectric material are provided.

To achieve a printer resolution of greater than 600 dpi, such as 1200 dpi or greater, there can be between 550 and 60,000 piezoelectric islands 300, for example 2,000 piezoelectric islands, in less than one square inch. Each piezoelectric island forms part of an associated individually activatable actuators. For example, there can be 2,048 piezoelectric islands in an area of less than one square inch if the pumping chamber is sized to eject fluid droplets of 2 pL. As another example, there can be about 60,000 piezoelectric islands in an area of less than one square inch if the pumping chamber is sized to eject fluid droplets of 0.01 pL.

Figure 5:
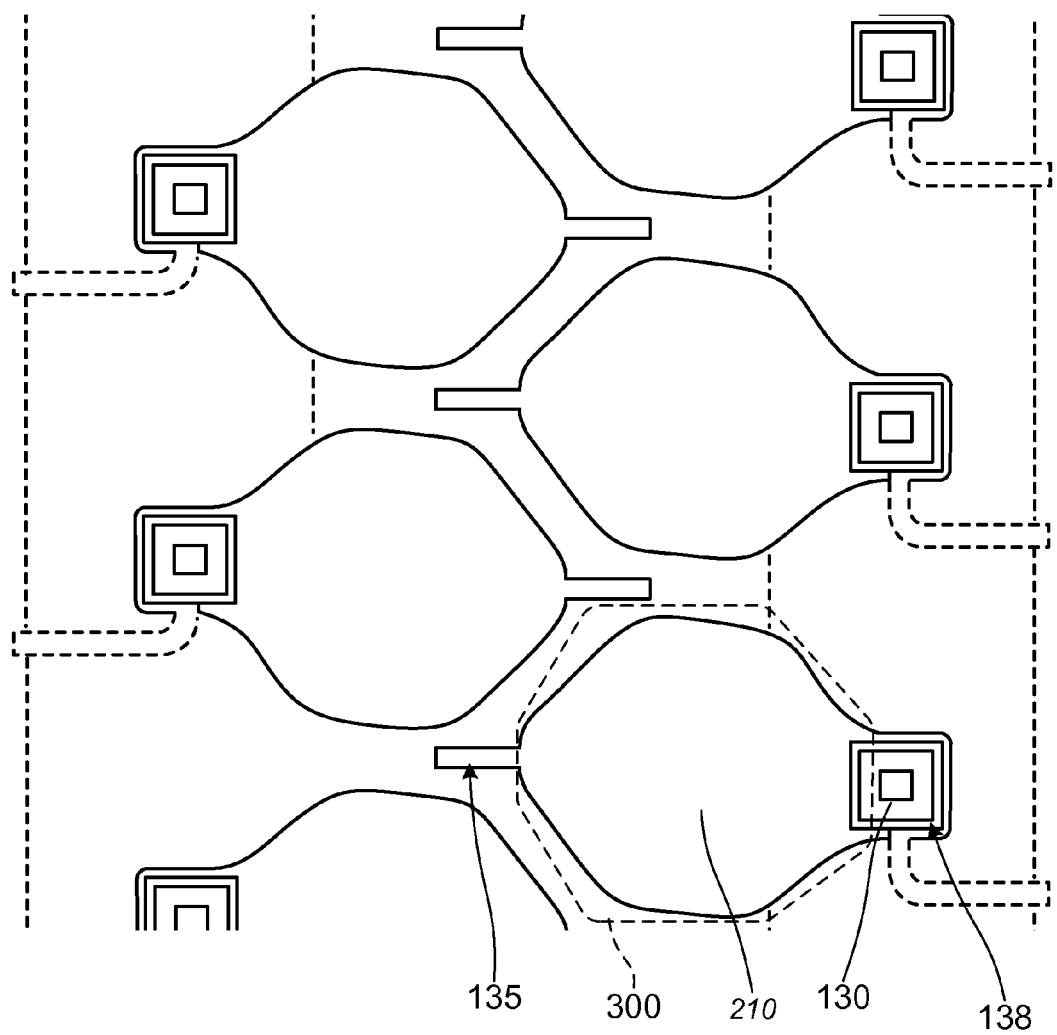
FIG. 5 is a schematic top view of pumping chambers in a printhead.

As shown in FIG. 5, the piezoelectric islands 300 (shown in phantom) can generally follow the perimeter of the pumping chambers 120 over which they are disposed. For example, the piezoelectric islands 300 can be a generally hexagonal or octagonal shape, or be more complex shapes. The corners of the piezoelectric islands 300 can be sharp or rounded, and as discussed above, the piezoelectric islands 300 can have curvilinear sections.

In embodiments, stripping steps can be conducted by dry etch rather than wet etch. Various masking materials can be used, e.g., a hard mask such as platinum or iridium. The ink jet printhead can be utilized to deliver any suitable material including pigmented material for forming images, biological samples, three-dimensional modeling pastes, and other materials. Other MEMS devices include other fluid ejection systems, acoustic, e.g., ultrasonic transducers, microactuators, filters, surface acoustic wave devices, and Fe RAMS.

The entire contents of all publications, patents, patent applications and other documents referenced to herein is hereby incorporated by reference.

Still further embodiments are within the following claims.

What is claimed is:

1. A method comprising:
   forming a NiCr alloy layer as a lower electrode,
   providing a PZT piezoelectric material on the NiCr alloy layer,
   forming a TiW layer on the PZT piezoelectric material,
   providing a mask material comprising a NiCr alloy on the TiW layer, wherein the TiW layer between the mask material and the PZT piezoelectric material improves an adhesion of the mask material to the PZT piezoelectric material,
   patterning the mask material by wet etching to form a mask that defines a location of a trench, and
   plasma etching the PZT piezoelectric material through the mask to form a feature including the trench in the PZT piezoelectric material, the trench having an aspect ratio of depth to width of about 2:1 or more and having a depth of about 1 micron or more.

2. The method of claim 1, wherein the trench in the PZT piezoelectric material has the depth of about 5 microns or more.

3. The method of claim 1, wherein the feature formed in the PZT piezoelectric material further includes an island having an edge shape other than a square or a rectangle.

4. The method of claim 1, wherein an etching rate of the plasma etching is about 50 nm/min or more.

5. The method of claim 4, wherein the etching rate of the plasma etching is about 100 nm/min or more.

6. The method of claim 1, wherein the PZT piezoelectric material is poled prior to the plasma etching, and the plasma etching is implemented without depoling the PZT piezoelectric material.

7. The method of claim 1, wherein the plasma etching is implemented while maintaining the PZT piezoelectric material below a Curie temperature of the PZT piezoelectric material.

8. The method of claim 1, wherein in the plasma etching, the mask is etched at a rate about four or more times less than a rate at which the PZT piezoelectric material is etched.

9. The method of claim 1, further comprising removing the mask by wet etching after the plasma etching.

10. The method of claim 1, wherein in the plasma etching, the PZT piezoelectric material is supported on a platen having a temperature of about 100° C. or less.

11. The method of claim 10, wherein the temperature of the platen is about 30° C. or less.

12. The method of claim 1, further comprising reducing a thickness of the PZT piezoelectric material after the plasma etching.

13. The method of claim 1, further comprising utilizing the plasma-etched PZT piezoelectric material in an actuator.

14. The method of claim 13, further comprising utilizing the actuator in an ink jet printhead.

15. The method of claim 1, wherein the plasma etching comprises exposing the PZT piezoelectric material through the mask to a gas mixture comprising argon, $C_4F_8$, and hydrogen ($H_2$).

16. A method comprising:
   forming a NiCr alloy layer as a lower electrode,
   providing a PZT piezoelectric material on the NiCr alloy layer,
   forming a TiW layer on the PZT piezoelectric material,
   depositing a metallic mask material comprising a NiCr alloy on the TiW layer, wherein the TiW layer between the metallic mask material and the PZT piezoelectric material improves an adhesion of the metallic mask material to the PZT piezoelectric material,
   patterning the metallic mask material by wet etching to form a mask that defines a location of a trench and a location of an island, and
   plasma etching the PZT piezoelectric material through the mask to form the trench and the island in the PZT piezoelectric material, the trench having an aspect ratio of depth to width of about 2 to 1 or more, the island having an edge shape other than a square or a rectangle,
   wherein in the plasma etching, the PZT piezoelectric material is supported on a platen having a temperature of about 100° C. or less.

17. A method of processing piezoelectric material, comprising:
   forming a NiCr alloy layer as a lower electrode,
   providing a PZT piezoelectric substrate on the NiCr alloy layer,
   forming a TiW layer on the PZT piezoelectric substrate,
   depositing a mask material comprising a NiCr alloy on the TiW layer, wherein the TiW layer between the mask material and the PZT piezoelectric substrate improves an adhesion of the mask material to the PZT piezoelectric substrate,
   patterning the mask material by wet etching to form a mask that defines locations of trenches,
   plasma etching the PZT piezoelectric substrate through the mask to form the trenches in the PZT piezoelectric substrate, and
   stripping the mask by wet etching after the plasma etching;
   wherein the plasma etching comprises using a gas mixture comprising argon, $C_4F_8$, and hydrogen ($H_2$).

18. The method of claim 17, wherein the mask material has a thickness of about 10 micron or less.

19. The method of claim 18, wherein the mask has features with an aspect ratio of about 10 to 1 or less.

20. The method of claim 17, wherein at least one of the trenches has a depth of about 5 microns or more.

* * * * *